United States Patent
Walker

(10) Patent No.: US 10,028,402 B1
(45) Date of Patent: Jul. 17, 2018

(54) PLANAR EXPANSION CARD ASSEMBLY

(71) Applicant: Seagate Technology LLC, Cupertino, CA (US)

(72) Inventor: Robert Irving Walker, Clearwater Beach, FL (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 15/466,391

(22) Filed: Mar. 22, 2017

(51) Int. Cl.
| | |
|---|---|
| H01R 12/00 | (2006.01) |
| H05K 7/14 | (2006.01) |
| H01R 12/72 | (2011.01) |
| H01R 12/73 | (2011.01) |
| H01R 43/26 | (2006.01) |

(52) U.S. Cl.
CPC ......... *H05K 7/1429* (2013.01); *H01R 12/721* (2013.01); *H01R 12/73* (2013.01); *H01R 43/26* (2013.01)

(58) Field of Classification Search
CPC ...... H01R 12/721; H01R 12/73; H01R 43/26; H01R 23/7068; H05K 7/1429; H05K 1/14; G06F 1/184; G06F 1/186; G06F 13/409
USPC ...................................................... 439/61, 65
See application file for complete search history.

(56) References Cited

U.S. PATENT DOCUMENTS

| | | | | |
|---|---|---|---|---|
| 4,333,696 A | * | 6/1982 | O'Neill | H01R 23/70 439/61 |
| 4,558,397 A | * | 12/1985 | Olsson | H05K 3/3442 174/541 |
| 5,436,800 A | * | 7/1995 | Maruska | G06F 1/184 211/41.17 |
| 5,515,515 A | * | 5/1996 | Kennedy | G06F 13/4081 361/679.02 |
| 5,557,506 A | * | 9/1996 | Wood | H05K 7/1429 361/729 |
| 5,568,610 A | * | 10/1996 | Brown | G06F 13/4072 439/955 |

(Continued)

FOREIGN PATENT DOCUMENTS

EP      0811932 A1    10/1997

OTHER PUBLICATIONS

Ning, Jia, "Open Compute Project—OCP Mezzanine card 2.0 Design Specification," Press release, Dec. 15, 2015, Version 1.00, 41 pages.

*Primary Examiner* — Abdullah Riyami
*Assistant Examiner* — Vladimir Imas
(74) *Attorney, Agent, or Firm* — Holzer Patel Drennan

(57) ABSTRACT

The disclosed technology includes an assembly of two planar expansion card cards, which provides functionality to be leveraged by an upper planar expansion card. The base planar expansion card includes a first connector A, a first connector B, a connector C, a first pass-through connector A configured to connect to the first connector A, and a first pass-through connector B configured to connect to the first connector B. An upper planar expansion card includes a second connector A and a second connector B. The second connector A and the second connector B connect to the first pass-through connector A and the first B connector pass-through, respectively. In some implementations, the second connector A and second connector B are configured for a PCI-E and the connector C is configured for Ethernet KR signals.

20 Claims, 5 Drawing Sheets

(56) References Cited

U.S. PATENT DOCUMENTS

| | | | | |
|---|---|---|---|---|
| 5,594,621 A * | 1/1997 | van Rumpt | G06F 1/184 | 361/679.32 |
| 5,648,892 A * | 7/1997 | Wieloch | H02M 7/003 | 361/707 |
| 5,876,218 A * | 3/1999 | Liebenow | H05K 5/0273 | 439/74 |
| 6,116,962 A * | 9/2000 | Laity | H01R 27/02 | 361/679.4 |
| 6,181,565 B1 * | 1/2001 | Schmitt | G06F 1/184 | 211/41.17 |
| 6,190,182 B1 * | 2/2001 | Liebenow | H05K 5/0273 | 439/74 |
| 6,222,739 B1 * | 4/2001 | Bhakta | G06F 1/184 | 257/686 |
| 6,261,104 B1 * | 7/2001 | Leman | G06F 1/184 | 439/61 |
| 6,547,602 B2 * | 4/2003 | Price | H01R 27/02 | 439/638 |
| 6,687,134 B2 * | 2/2004 | Vinson | G06F 1/184 | 211/41.17 |
| 6,731,515 B2 * | 5/2004 | Rhoads | H05K 1/14 | 361/785 |
| 6,768,642 B2 * | 7/2004 | Hines | G06F 1/184 | 165/185 |
| 6,775,147 B2 * | 8/2004 | Kim | G06F 1/184 | 211/41.17 |
| 6,805,560 B1 | 10/2004 | Budny et al. | | |
| 6,894,895 B2 * | 5/2005 | Willis | G06F 1/184 | 361/679.32 |
| 6,924,986 B1 * | 8/2005 | Sardella | H05K 7/1429 | 361/785 |
| 7,064,955 B2 * | 6/2006 | Harris | G06F 1/184 | 165/80.3 |
| 7,082,487 B2 | 7/2006 | Darwish et al. | | |
| 7,247,032 B2 * | 7/2007 | Merz | H01R 13/6658 | 439/607.01 |
| 7,280,364 B2 * | 10/2007 | Harris | G06F 1/184 | 257/E23.099 |
| 7,440,293 B2 * | 10/2008 | Hood, III | G06F 1/184 | 361/807 |
| 7,502,882 B2 * | 3/2009 | Stahl | H05K 1/14 | 439/65 |
| 7,686,619 B2 * | 3/2010 | Bell, Jr. | G06F 13/409 | 439/631 |
| 7,706,147 B2 * | 4/2010 | Kunz | H05K 7/1429 | 361/679.32 |
| 7,746,654 B2 * | 6/2010 | Franz | H05K 7/1487 | 361/679.02 |
| 8,107,256 B1 * | 1/2012 | Kondrat | H05K 7/1429 | 361/788 |
| 8,161,429 B1 * | 4/2012 | Chan | G06F 17/5045 | 716/100 |
| 8,286,009 B2 * | 10/2012 | Slaton | G06F 1/26 | 710/302 |
| 8,287,290 B2 * | 10/2012 | Cohen | H01R 12/73 | 439/66 |
| 8,585,442 B2 * | 11/2013 | Tuma | G06F 1/185 | 361/737 |
| 8,749,967 B2 * | 6/2014 | Dang | G06F 1/185 | 361/679.4 |
| 8,979,551 B2 * | 3/2015 | Mongold | H01R 12/73 | 439/74 |
| 9,342,116 B2 | 5/2016 | Lai et al. | | |
| 9,564,712 B1 | 2/2017 | Shih | | |
| 9,710,421 B2 * | 7/2017 | Tamarkin | G06F 13/409 | |
| 2008/0055847 A1 * | 3/2008 | Belady | H05K 1/14 | 361/679.49 |
| 2014/0003010 A1 * | 1/2014 | Lee | H05K 7/1485 | 361/759 |

* cited by examiner

PLANAR EXPANSION CARD ASSEMBLY

SUMMARY

According to one implementation, the disclosed technology includes an assembly of at least two planar expansion cards. The assembly includes a base planar expansion card including a first connector A, a first connector B, and a connector C. Each of the first connector A, the first connector B, and the connector C are configured on a bottom surface of the base planar expansion card. A first pass-through connector A is configured to connect to the first connector A and a first pass-through connector B is configured to connect to the first connector B. Each of the first pass-through connector A and the first pass-through connector B are configured on a top surface of the base planar expansion card. An upper planar expansion card includes a second connector A and a second connector B. The second connector A connects to the first pass-through connector A on the base planar expansion card. The second connector B connects to the first B connector pass-through on the base planar expansion card. The second connector A and second connector B are configured for a PCI-E bus and the connector C is configured for Ethernet signals.

In one implementation, the assembly allows the use of a PCI-E bus to be leveraged by an upper planar expansion card, which may otherwise be lost to a lower passive Ethernet base planar expansion card. Other configurations are contemplated.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. These and various other features and advantages will be apparent from a reading of the following detailed description.

BRIEF DESCRIPTIONS OF THE DRAWINGS

DETAILED DESCRIPTIONS

Figure 1A:
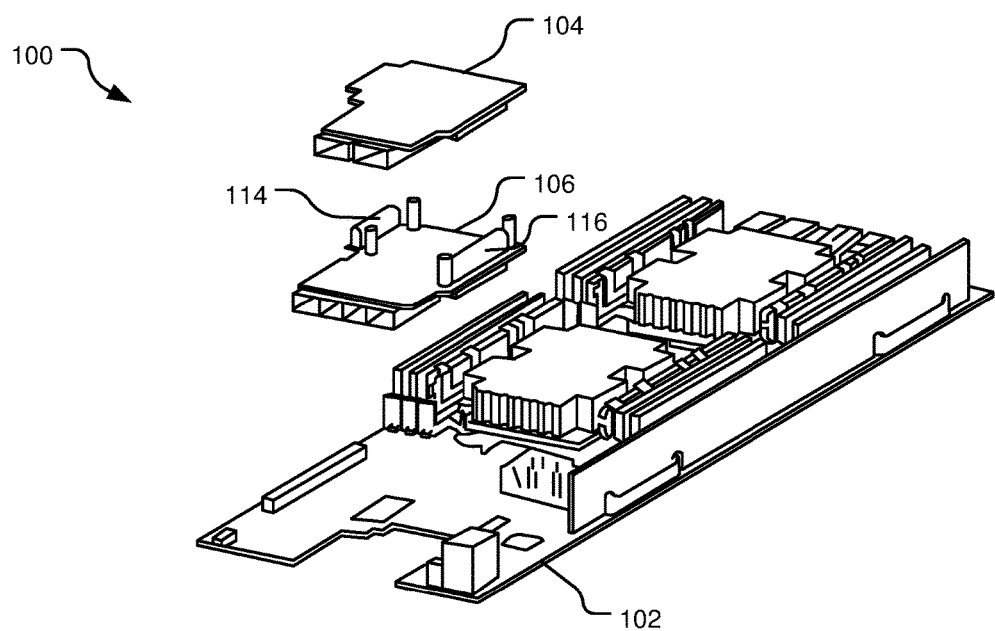
FIG. 1A illustrates a perspective view of an example unassembled planar expansion card assembly.

An expansion card is a printed circuit board that may be used with a motherboard or other computer component to provide extended functionality to a computing device. In some implementations, a planar expansion card (e.g., a mezzanine card) is installed by plugging the card vertically directly onto board to board (B2B) connectors on a base-board plane of a motherboard. The motherboard provides power to power pins located on a card connector.

In some implementations, a planar expansion card is a single card that has any number of connectors, which may be used for different purposes, signal definition, and/or pinouts (e.g., any PCI-E (Express)×8 expansion card, any PCI-E (Express)×16 expansion card, FC, SAS, IB, Ethernet, FLASH storage, ASIC, FPGA, etc.).

For example, in some implementations, a planar expansion card may be a single card that has three card connectors (described herein as connectors "A," "B," & "C"), each of the connectors designed for one intended use. The connectors A and B may be used for a PCI bus (e.g., PCI-E, an interchangeable, local computer bus for attaching hardware devices in a computer, etc.). The connector C may be used for Ethernet (e.g., "Ethernet KR" or 10GBASE-KR) signals. However, depending on the implementation, connectors A, B, and C may be used for Ethernet KR signals.

In some implementations, if a planar expansion card is used for a PCI-E bus (via connectors A and B), the ability to use the planar expansion card for Ethernet signals (via connector C) is lost. Likewise, if the planar expansion card is used for Ethernet signals (via connector C), the ability to use the planar expansion card for a PCI-E bus (via connectors A and B) is lost. Or, in another example, if only PCI-E×8 is used on connector A, then the second×8 on connector B may be lost.

The disclosed technology includes an assembly of stacked planar expansion cards (e.g., at least two planar expansion cards) with pass-through connectors to facilitate use of different connectors on the multiple expansion cards. For example, the assembly may include a passive Ethernet connector expansion card with a C connector located on the bottom surface and pass-through connectors on the top surface of the base planar expansion card configured to connect to a connector A and a connector B located on a second upper planar expansion card above the base planar expansion card.

In some implementations, the connector(s) A and the pass-through connector(s) for connector A have 120 pins (e.g., mezzanine card connector). The pin assignment of connector A has PCI-E×8 Gen3, I2C and NC-SI side band signals, and power pins. A connector A can also be used for up to 8×KR. A connector A can be used independently.

In some implementations, the connector(s) B and the pass-through connector(s) for connector B have 80 pins (e.g., a mezzanine card 2.0 Rev0.40). The pin assignment of a connector B may be PCI-E×8 Gen3, which can be combined to ×16 with a connector A. A connector B can also be used for up to 8×KR. A connector B cannot be used independently and may be used together with a connector A. A 64 pin connector C may be added in a mezzanine card (e.g., Mezzanine card 2.0 Rev0.45). The pin assignment of connector C has up to 4×KR, their low speed and I2C signals, and power pins. A connector C is created to support the use case of KR only. A connector C may be used independently on a mezzanine card side. A KR mezzanine card implementation with a connector C may not have a connector A and connector B on the card side.

The disclosed assembly provides for any order of pass-through to connectors on different expansion cards and provides functionality to be leveraged by an upper planar expansion card, which may otherwise may be lost to a single base planar expansion card. For example, the use of the PCI-E bus may be leveraged by the second upper planar expansion card, which otherwise would be lost due to the lower passive Ethernet base planar expansion card. In some implementations, a standard planar expansion card may be used for the connectors A and B in the upper planar expansion card, and a custom base planar expansion card, which includes pass-throughs to the connectors A and B in the upper planar expansion card may be used for connector C in the lower base planar expansion card.

The disclosed assembly may include at least two planar expansion cards. For example, in some implementations, the stack assembly may include stacking two planar expansion cards, as described in FIG. 2. In some implementations, the stack assembly may include stacking three planar expansion cards, as described in FIG. 3. The capability of using at least two planar expansion cards provide stack height adjustability.

FIG. 1A illustrates a perspective view of an example unassembled planar expansion card assembly 100. In this implementation, the unassembled planar expansion card assembly 100 includes two planar expansion cards and a mother board assembly 102. In some implementations, the planar expansion card assembly 100 may include three or more planar expansion cards.

The planar expansion card assembly 100 in FIG. 1A provides stacking of two planar expansion cards (e.g., an upper planar expansion card 104 (e.g., 2×QSFP28) and a base planar expansion card 106 (e.g., 4×SFP+)). In FIG. 1A, the base planar expansion card 106 includes a first connector A (not shown), a first connector B (not shown), a connector C (not shown), a pass-through connector A 114, and a pass-through connector B 116. An upper planar expansion card 104 includes a second connector A (not shown) and a second connector B (not shown). The pass-through connector A 114 and the pass-through connector B 116 on the base planar expansion card 106 connect to the second connector A and a second connector B on the upper planar expansion card 104, respectively.

Specifically, the planar expansion card assembly 100 is configured to allow for the passive Ethernet connector base planar expansion card 106 using the connector C (not shown) located on a base planar expansion card 106. The base planar expansion card 106 also includes a pass-through connector A 114 and a pass-through connector B 116 to the upper planar expansion card 104 above the base planar expansion card 106. The planar expansion card assembly 100 allows the use of a PCI-E bus to be leveraged by the upper planar expansion card 104, which otherwise would be lost (due to the lower passive Ethernet base planar expansion card 106). In some implementations, the connector A and the pass-through connector 114 for connector A have 120 pins. In some implementations, the connector B and the pass-through connector B 116 for connector B have 80 pins.

In the planar expansion card assembly 100, a standard planar expansion card may be used for the connectors A and B in the upper stack layer, and a custom planar expansion card including pass-throughs may be used for connector C in the lower stack layer.

Figure 1B:
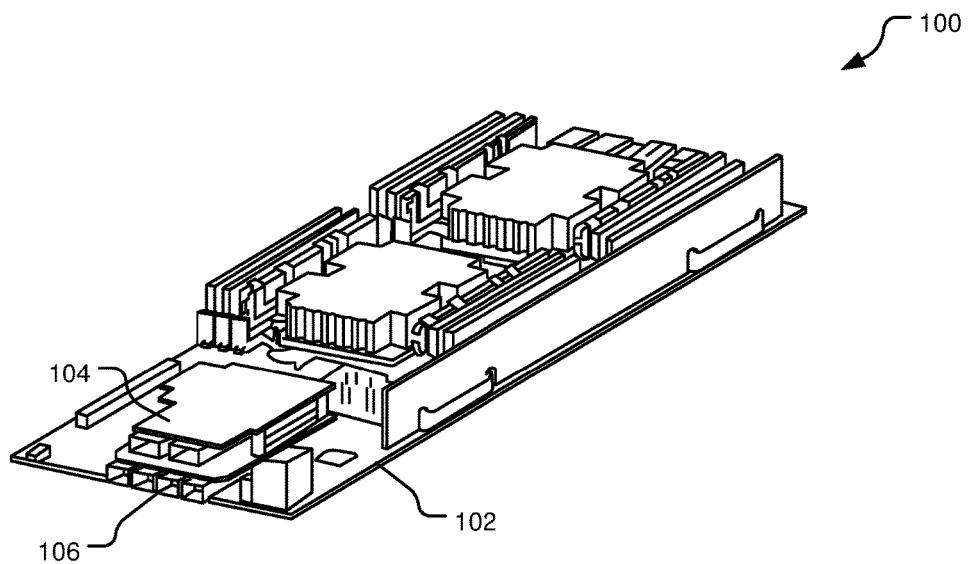
FIG. 1B illustrates a perspective view of an example assembled planar expansion card assembly.

FIG. 1B illustrates a perspective view of an example assembled open planar expansion card assembly 100. In this implementation, the assembled planar expansion card assembly 100 includes two planar expansion cards assembled into a mother board assembly 102.

The planar expansion card assembly 100 in FIG. 1B provides stacking of two planar expansion cards (e.g., an upper planar expansion card 104 (e.g., 2×QSFP28) and a base planar expansion card 106 (e.g., 4×SFP+)). In FIG. 1B, the base planar expansion card 106 includes a first connector A (not shown), a first connector B (not shown), a connector C (not shown), a pass-through connector A 114, and a pass-through connector B 116. An upper planar expansion card 104 includes a second connector A (not shown) and a second connector B (not shown). The pass-through connector A 114 and the pass-through connector B 116 on the base planar expansion card 106 connect to the second connector A and a second connector B on the upper planar expansion card 104, respectively.

Specifically, the planar expansion card assembly 100 is configured to allow for the passive Ethernet connector base planar expansion card 106 using the connector C (not shown) located on a bottom surface of the base planar expansion card 106. The base planar expansion card 106 also includes a pass-through connector A and a pass-through connector B to the upper planar expansion card 104 above the base planar expansion card 106. The planar expansion card assembly 100 allows the use of a PCI-E bus to be leveraged by the upper planar expansion card 104, which otherwise would be lost (due to the lower passive Ethernet base planar expansion card 106).

In the planar expansion card assembly 100, a standard planar expansion card (e.g., a mezzanine with any number of functionalities, such as Ethernet, SAS, Fiber-channel, Infiniband, etc.) may be used for the connectors A and B in the upper stack layer, and a custom planar expansion card including pass-throughs may be used for connector C in the lower stack layer. In some implementations, the connector A and the pass-through connector (not shown) for connector A have 120 pins. In some implementations, the connector B and the pass-through connector (not shown) for connector B have 80 pins.

Figure 2:
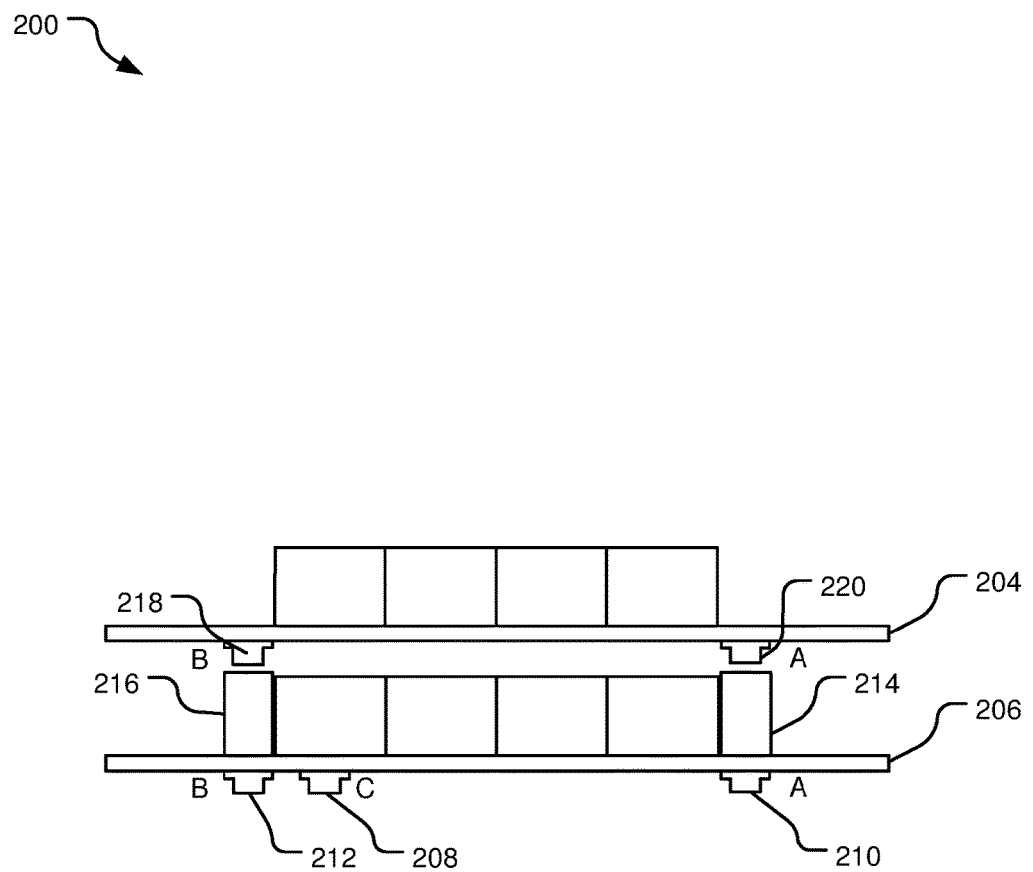
FIG. 2 illustrates a schematic diagram of a side view of an example unassembled planar expansion card assembly with two planar expansion cards.

FIG. 2 illustrates a schematic diagram of a side view of an example planar expansion card assembly 200 with two planar expansion cards. The planar expansion card assembly 200 includes stacking of at least two planar expansion cards. In FIG. 2, the planar expansion card assembly 200 includes a base planar expansion card 206 and an upper planar expansion card 204. The base planar expansion card 206 includes a first connector A 210, a first connector B 212, a connector C 208, a pass-through connector A 214, and a pass-through connector B 216. An upper planar expansion card 204 includes a second connector A 220 and a second connector B 218.

In the planar expansion card assembly 200, the base planar expansion card 206 is a passive Ethernet connector planar expansion card using the C connector 208 located on the bottom surface of the base planar expansion card 206. The planar expansion card assembly 200 is also configured to provide connections from second connector A 220 and a second connector B 218 to a PCI-E bus via the pass-through connector A 214 and the pass-through connector B 216 located on the base planar expansion card 206. In some implementations, the first connector A 210, second connector A 220, and the pass-through connector A 214 have 120 pins. In some implementations, the first connector B 212, the second connector B 218, and the pass-through connector B 216 have 80 pins.

The planar expansion card assembly 200 allows the use of a PCI-E bus (not shown) to be leveraged by the second upper planar expansion card 204, which otherwise would be lost (due to the lower passive Ethernet base planar expansion card 206).

Figure 3:
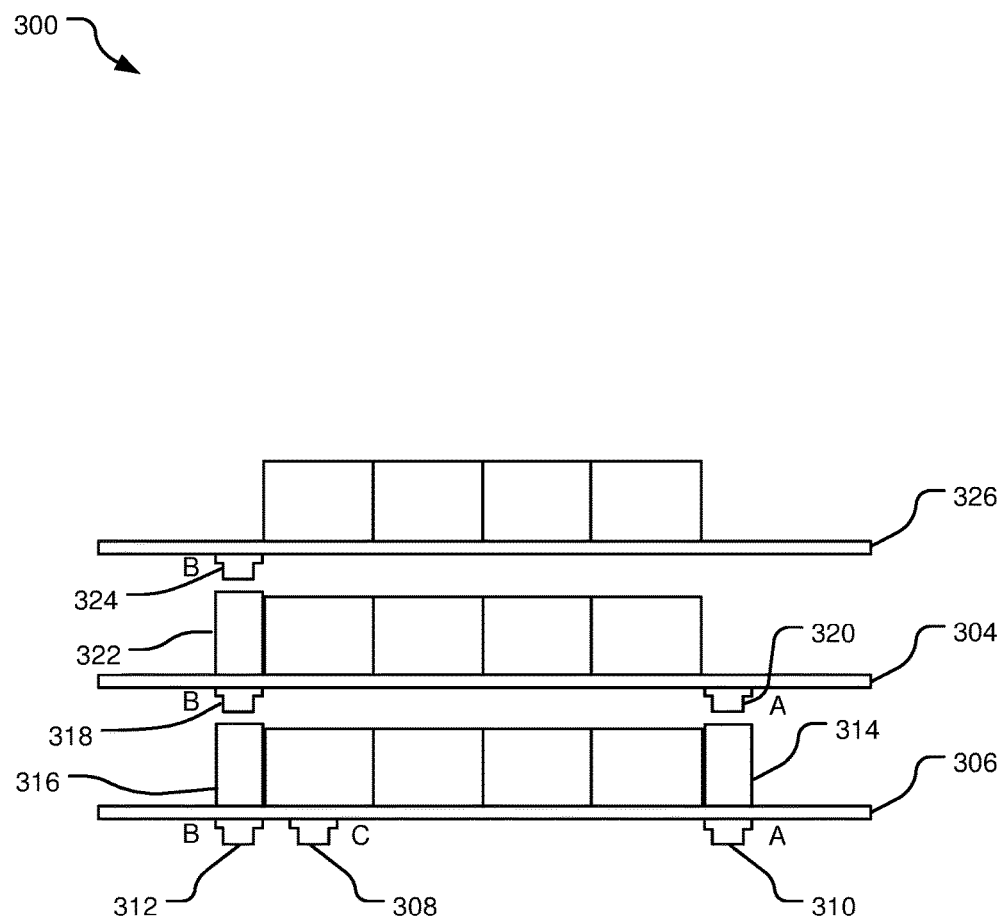
FIG. 3 illustrates a schematic diagram of a side view of an example unassembled planar expansion card assembly with three planar expansion cards.

FIG. 3 illustrates a schematic diagram of a side view of an example planar expansion card assembly 300 with three planar expansion cards. In FIG. 3, the planar expansion card assembly 300 includes a base planar expansion card 306, a mid planar expansion card 304, and an upper planar expansion card 326. The base planar expansion card 306 includes a first connector A 310, a first connector B 312, a connector C 308, a pass-through connector A 314, and a first pass-through connector B 316. The mid planar expansion card 304 includes a second connector A 320, a second connector B 318, and a second pass-through connector B 322. The upper planar expansion card 326 includes a third connector B 324. In the disclosed technology, the PCI-E bus may be bifurcated. For example, the ×16 bus may be split into two per ×8, hence, connectors A, B, and C can all be used independently from each other.

In the planar expansion card assembly 300, the base planar expansion card 306 is a passive Ethernet connector planar expansion card including the C connector 308 located on the bottom surface of the base planar expansion card 306. The planar expansion card assembly 300 is also configured to provide connections from second connector A 320 and a third connector B 324 to a PCI-E bus via the pass-through connector A 314 and the second pass-through connector B 322 (via the first pass-through connector B 316). In some implementations, the first connector A, the second connector A, and the pass-through connector A have 120 pins. In some implementations, the first connector B, the second connector B, the third connector B, the first pass-through connector B, and the second pass-through connector B have 80 pins.

The planar expansion card assembly 300 allows the use of a PCI-E bus (not shown) to be leveraged by the upper planar expansion card 326, which otherwise would be lost (due to the lower passive Ethernet base planar expansion card 306).

Figure 4:
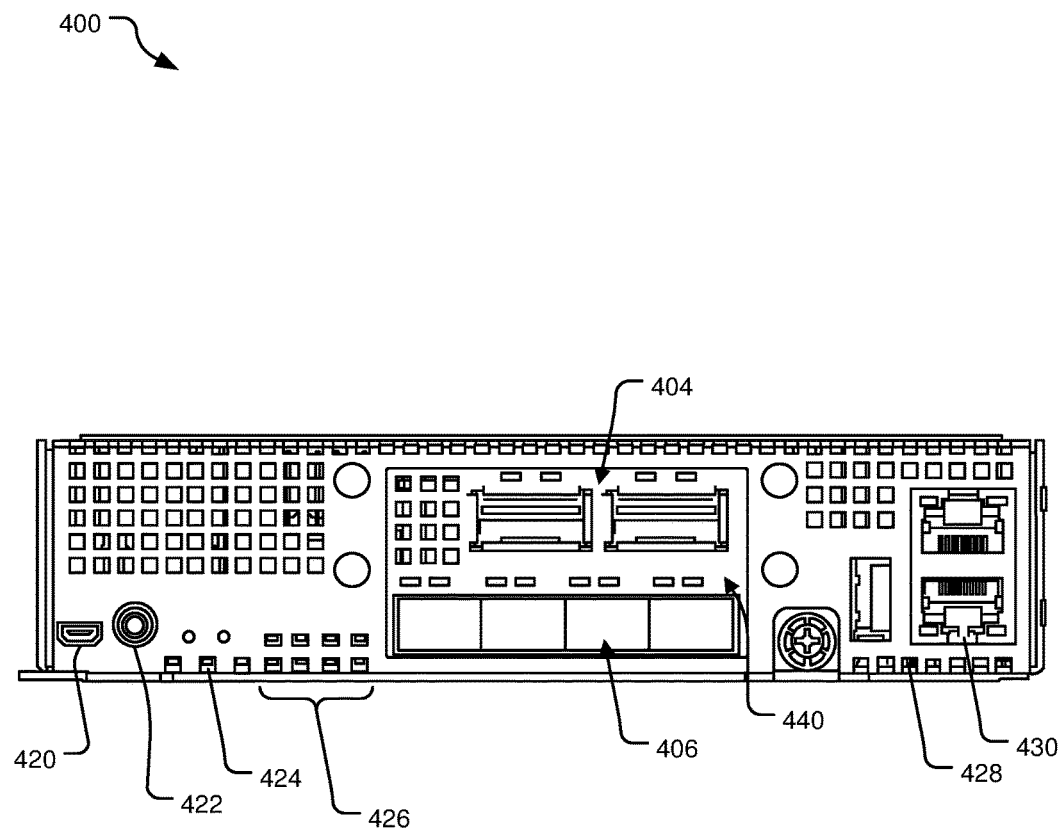
FIG. 4 is a schematic diagram of a side elevation view of an example 1U controller with an example planar expansion card assembly.

FIG. 4 is a schematic diagram of a side elevation view of an example 1U (1 rack unit, 1.75 inches (44.45 mm)) controller 400 with a planar expansion card assembly 440. An upper planar expansion card 404 and a base planar expansion card 406 (a custom card 4×SFP+) are incorporated into the IU controller 400 in the planar expansion card assembly 440. In this implementation, an HDMI connector 420, a serial port 422, an ID, Fault and OK LEDs 424, post LEDs 426, a USB 3.0 428, and a Duel RJ45 430 are shown on the IU controller 400.

Inside the IU controller 400, an upper planar expansion card 404, includes connectors A and B (not shown). A base planar expansion card 406 includes a connector C. The connector C may be used for Ethernet serializer/deserializer signals and does not preclude a Physical Layer IC from being added to the base planar expansion card 406 to be active. Two pass-through connectors (a pass-through connector A and a pass-through connector B) are located on a top surface of the base planar expansion card. The pass-through connector A connects to connector A and the pass-through connector B connects to connector B.

In this implementation, the planar expansion card assembly 440 is configured to allow for a passive Ethernet connector planar expansion card 406 using the C connector on the base planar expansion card and pass-through connectors to connectors A and B on the second upper planar expansion card 404 above the base planar expansion card. The planar expansion card assembly allows the use of the PCI-E×16 bus to be leveraged by the second planar expansion card 404, which otherwise would be lost (due to the lower passive Ethernet base planar expansion card).

Figure 5:
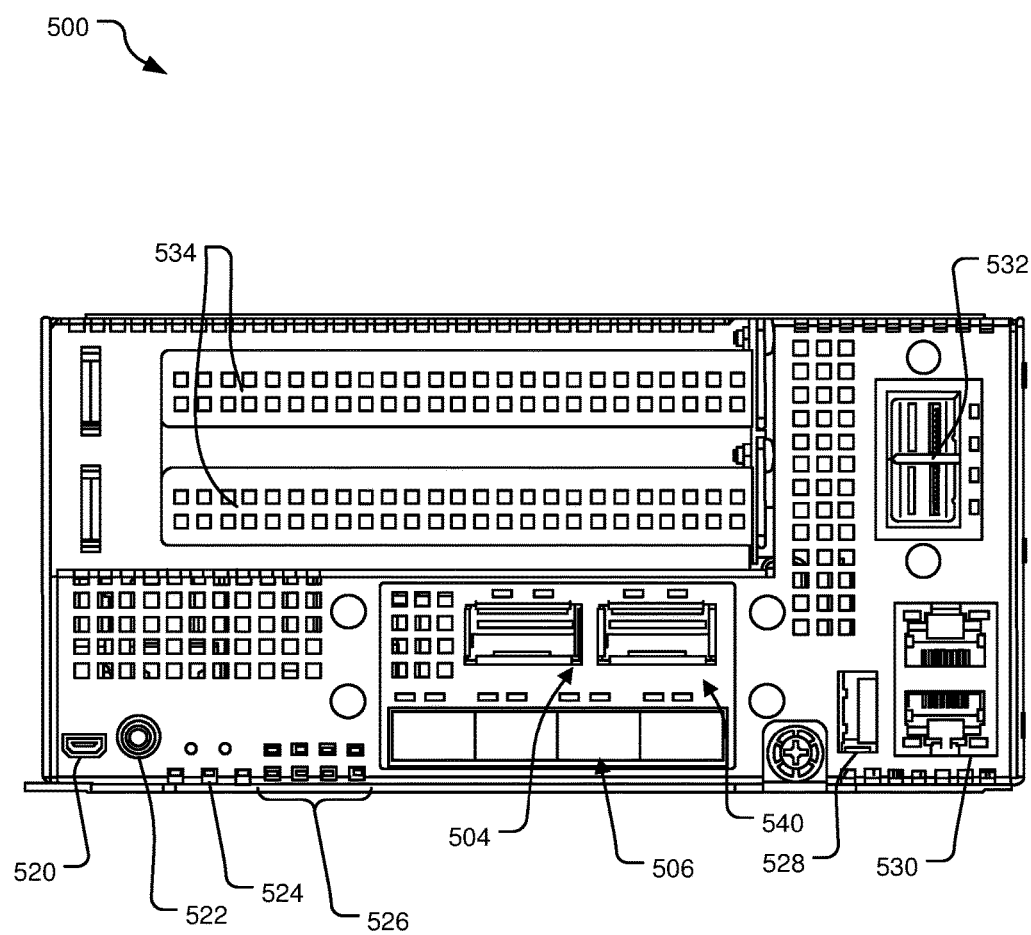
FIG. 5 is a schematic diagram of a side elevation view of an example 2U controller with an example planar expansion card assembly.

FIG. 5 is a schematic diagram of a side elevation view of an example 2U (1 rack unit, 3.50 inches (88.90 mm)) controller 500 with a planar expansion card assembly 540. In some implementations, the controller may be a Electronic Industries Alliance 310 1.75" "U" or a Open Compute Project OpenU at 47 mm.

An upper planar expansion card 504 and a base planar expansion card 506 (a custom card 4×SFP+) are incorporated into the IU controller 500 in a planar expansion card assembly 540. In this implementation, an HDMI connector 520, a serial port 522, an ID, Fault and OK LEDs 524, post LEDs 526, a USB 3.0 528, a Duel RJ45 530, a 2×PCI-E Card Slots 534, and a PCI-E/SAS expansion 532 are shown on the IU controller 500.

Inside the 2U controller 500, an upper planar expansion card 504, includes connectors A and B (not shown). A base planar expansion card 506 includes a connector C. Two pass-through connectors (a pass-through connector A and a pass-through connector B) are located on a top surface of the base planar expansion card. The pass-through connector A connects to connector A and the pass-through connector B connects to connector B.

In this implementation, the planar expansion card assembly 540 is configured to allow for a passive Ethernet connector base planar expansion card 506 using the C connector on the bottom surface of the base planar expansion card and pass-through connectors to connectors A and B on a second upper planar expansion card 504 above the base planar expansion card. The planar expansion card assembly allows the use of the PCI-E×16 bus to be leveraged by the second planar expansion card 504, which otherwise would be lost (due to the lower passive Ethernet mezzanine).

Although the following descriptions are tailored to example existing industry sizes, the example assemblies can be sized to fit various dimensions in a variety of applications. For example, the assembly can be used with a variety of standardized cards.

The above specification, examples, and data provide a complete description of the structure and use of exemplary embodiments of the invention. Since many embodiments of the invention can be made without departing from the spirit and scope of the invention, the invention resides in the claims hereinafter appended. Furthermore, structural features of the different embodiments may be combined in yet other embodiments without departing from the recited claims.

What is claimed is:

1. An assembly comprising:
 a base planar expansion card including:
  a first connector A, a first connector B, and a connector C, each of the first connector A, the first connector B, and the connector C configured on a bottom surface of the base planar expansion card, and
  a first pass-through connector A configured to connect to the first connector A and a first pass-through connector B configured to connect to the first connector B, each of the first pass-through connector A and the first pass-through connector B configured on a top surface of the base planar expansion card; and
 an upper planar expansion card including:
  a second connector A and a second connector B, the second connector A configured to connect to the first pass-through connector A on the base planar expansion card and the second connector B configured to connect to the first B connector pass-through on the base planar expansion card.

2. The assembly of claim 1, wherein each of the first connector A, the second connector A, and the first pass-through connector A have 120 pins.

3. The assembly of claim 1, wherein each of the first connector B, the second connector B, and the first pass-through connector B have 80 pins.

4. The assembly of claim 1, wherein at least one of the first connector A and the second connector A are configured for a PCI-E bus via the first pass-through connector A.

5. The assembly of claim 1, wherein at least one of the first connector B and the second connector B are configured for a PCI-E bus via the first pass-through connector B.

6. The assembly of claim 1, wherein the connector C is configured for Ethernet KR signals or 10GBASE-KR signals.

7. A system comprising:
a base planar expansion card including:
a first connector, a second connector, and a third connector, each of the first, second and third connectors configured on a bottom surface of the base planar expansion card, and
a first pass-through connector configured to connect to the first connector and a second pass-through connector configured to connect to the second connector, each of the first pass-through connector and the second pass-through connector configured on a top surface of the base planar expansion card;
a midplane expansion card including:
a first midplane connector and a second midplane connector, each of the first midplane connector and the second midplane connector configured on a bottom surface of the midplane expansion card, and
a midplane pass-through connector configured to connect to the second midplane connector, the midplane pass-through connector configured on a top surface of the midplane expansion card; and
an upper plane expansion card including:
an upper plane connector configured on a bottom surface of the upper plane expansion card and configured to connect to the midplane pass-through connector on the midplane expansion card.

8. The system of claim 7, wherein each of the first connector, the first midplane connector, and the first pass-through connector have 120 pins.

9. The system of claim 7, wherein each of the second connector, the second midplane connector, the upper plane connector, the second pass-through connector, and the midplane pass-through connector have 80 pins.

10. The system of claim 7, wherein the upper plane connector on the upper plane expansion card is configured for a PCI-E bus via the first connector, the first midplane connector, the midplane pass-through connector, and the first pass-through connector.

11. The system of claim 7, wherein at least one of the first connector and the first midplane connector are configured for a PCI-E bus.

12. An apparatus comprising:
a base planar expansion card including:
a first connector A, a first connector B, and a connector C, each of the first connector A, the first connector B, and the connector C configured on a bottom surface of the base planar expansion card, and
a first pass-through connector A configured to connect to the first connector A and a first pass-through connector B configured to connect to the first connector B, each of the first pass-through connector A and the first pass-through connector B configured on a top surface of the base planar expansion card.

13. The apparatus of claim 12, wherein the first pass-through connector A is further configured to connect to a second connector A located on an upper planar expansion card.

14. The apparatus of claim 13, wherein the second connector A is configured for a PCI-E bus via the first pass-through connector A on the base planar expansion card.

15. The apparatus of claim 12, wherein the first pass-through connector B is further configured to connect to a second connector B located on an upper planar expansion card.

16. The apparatus of claim 15, wherein the second connector B is configured for a PCI-E bus via the first pass-through connector B on the base planar expansion card.

17. A method comprising:
connecting a mid planar expansion card by:
configuring a first connector A and a first connector B on a bottom surface of the mid planar expansion card, and
connecting a first pass-through connector B to the first connector B, the first pass-through connector B configured on a top surface of the mid planar expansion card.

18. The method of claim 17, further comprising:
connecting the first connector A on the mid planar expansion card to a first pass-through connector A on a base planar expansion card; and
connecting the first connector B on the mid planar expansion card to a second pass-through connector B on the base planar expansion card.

19. The method of claim 18, further comprising configuring a second connector A, a second connector B, and a connector C on the base planar expansion card.

20. The method of claim 19, further comprising:
configuring a third connector B on the bottom surface of an upper planar expansion card;
connecting the third connector B to the first pass-through connector B on the mid planar expansion card;
configuring the third connector B and the first connector A on the mid planar expansion card for a PCI-E bus; and
configuring the connector C on the base planar expansion card for Ethernet KR signals.

* * * * *